United States Patent
Chang-Hasnain et al.

(10) Patent No.: US 12,068,580 B2
(45) Date of Patent: Aug. 20, 2024

(54) OXIDE SPACER HCG VCSELS AND FABRICATION METHODS

(71) Applicant: THE REGENTS OF THE UNIVERSITY OF CALIFORNIA, Oakland, CA (US)

(72) Inventors: Constance J. Chang-Hasnain, Palo Alto, CA (US); Kevin T. Cook, Berkeley, CA (US); Jipeng Qi, El Cerrito, CA (US); Jiaxing Wang, Albany, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 924 days.

(21) Appl. No.: 17/090,773

(22) Filed: Nov. 5, 2020

(65) Prior Publication Data
US 2021/0135429 A1 May 6, 2021

Related U.S. Application Data

(63) Continuation of application No. PCT/US2019/031686, filed on May 10, 2019.
(Continued)

(51) Int. Cl.
*H01S 5/00* (2006.01)
*H01S 5/183* (2006.01)
(Continued)

(52) U.S. Cl.
CPC ...... *H01S 5/18311* (2013.01); *H01S 5/18316* (2013.01); *H01S 5/18358* (2013.01);
(Continued)

(58) Field of Classification Search
CPC ............ H01S 5/18311; H01S 5/18316; H01S 5/18358; H01S 5/18361; H01S 5/18363; H01S 5/18386; H01S 5/2081; H01S 5/423
See application file for complete search history.

(56) References Cited

U.S. PATENT DOCUMENTS

| | | | |
|---|---|---|---|
| 2012/0128019 A1* | 5/2012 | Chang-Hasnain | H01S 5/18386 372/45.01 |
| 2013/0209110 A1* | 8/2013 | Fattal | H01S 5/0424 372/99 |

(Continued)

FOREIGN PATENT DOCUMENTS

| CN | 105977786 | 9/2016 |
|---|---|---|
| WO | 2019217794 A1 | 11/2019 |

OTHER PUBLICATIONS

State Intellectual Property Office of the People's Republic of China, The first office notification issued Jun. 7, 2023, related Chinese patent application No. 100082, Chinese-language document, pp. 1-11, English-language translation, pp. 12-22, with claims examined, pp. 23-27.
(Continued)

*Primary Examiner* — Kinam Park
(74) *Attorney, Agent, or Firm* — O'BANION & RITCHEY LLP; John P. O'Banion

(57) ABSTRACT

A high-contrast grating (HCG) structure and method of fabrication. The grating of the HCG is formed over a structural spacer layer, allowing a wider range of grating patterns, such as post and other forms which are lack structural support when fabricated over an air spacing beneath the grating elements. The technique involves etching the HCG grating, followed by oxidizing through this HCG grating into an oxide spacer layer beneath it creating
(Continued)

a low-index area beneath the grating. This form of HCG reflector can be utilizes as upper and/or lower reflectors in fabricating vertical cavity surface emitting lasers (VCSELs).

26 Claims, 8 Drawing Sheets

Related U.S. Application Data

(60) Provisional application No. 62/670,071, filed on May 11, 2018.

(51) Int. Cl.
  *H01S 5/20* (2006.01)
  *H01S 5/42* (2006.01)
  *H01S 5/026* (2006.01)
  *H01S 5/34* (2006.01)

(52) U.S. Cl.
  CPC ...... *H01S 5/18361* (2013.01); *H01S 5/18363* (2013.01); *H01S 5/18386* (2013.01); *H01S 5/2081* (2013.01); *H01S 5/423* (2013.01); *H01S 5/026* (2013.01); *H01S 5/18341* (2013.01); *H01S 5/18355* (2013.01); *H01S 5/34* (2013.01)

(56) References Cited

U.S. PATENT DOCUMENTS

| | | | |
|---|---|---|---|
| 2015/0288146 A1* | 10/2015 | Chang-Hasnain | H01S 5/18319 438/27 |
| 2015/0362641 A1* | 12/2015 | Boyraz | B23K 9/26 359/571 |
| 2016/0301188 A1* | 10/2016 | Mathai | G02B 27/0905 |
| 2017/0214218 A1* | 7/2017 | Tan | H01S 5/0267 |
| 2018/0073987 A1 | 3/2018 | Chang-Hasnain | |
| 2019/0064532 A1* | 2/2019 | Riley, Jr. | G02B 6/428 |

OTHER PUBLICATIONS

ISA/KR, Korean Intellectual Property Office (KIPO), International Search Report and Written Opinion issued Aug. 30, 2019, related PCT international application No. PCT/US2019/031686, pp. 1-12, claims searched, pp. 13-17.

* cited by examiner

OXIDE SPACER HCG VCSELS AND FABRICATION METHODS

CROSS-REFERENCE TO RELATED APPLICATIONS

This application claims priority to, and is a 35 U.S.C. § 111(a) continuation of, PCT international application number PCT/US2019/031686 filed on May 10, 2019, incorporated herein by reference in its entirety, which claims priority to, and the benefit of, U.S. provisional patent application Ser. No. 62/670,071 filed on May 11, 2018, incorporated herein by reference in its entirety. Priority is claimed to each of the foregoing applications.

The above-referenced PCT international application was published as PCT International Publication No. WO 2019/217794 A1 on Nov. 14, 2019, which publication is incorporated herein by reference in its entirety.

STATEMENT REGARDING FEDERALLY SPONSORED RESEARCH OR DEVELOPMENT

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to vertical-cavity surface-emitting laser (VCSEL) devices, and more particularly to fabrication methods for oxide spaces In VCSEL devices.

2. Background Discussion

A high-contrast grating (HCG) is an excellent reflector for use in a vertical-cavity surface-emitting laser (VCSEL) because it offers broadband reflectivity and polarization control, while requiring less than 10% of the material used in a semiconductor distributed Bragg reflector (DBR).

However, HCG reflectors for VCSELs, as previously demonstrated, were etched to produce an air spacer between the HCG and the rest of the VCSEL. This air spacer limits further semiconductor processing while limiting two-dimensional HCGs to mesh-type designs due to the requirement for mechanical stability.

The presented technology overcomes these spacer limitations, while providing additional VCSEL benefits.

BRIEF SUMMARY

The present disclosure describes a new method of fabricating HCG reflectors for VCSELs, which overcomes a number of previous shortcomings, such as requiring the HCG to be limited to a two-dimensional mesh configuration to provide mechanical stability.

Instead of removing the layer beneath the HCG using a selective etchant to produce an air spacer, the spacer layer utilized beneath the HCG is oxidized to form a low-index oxide spacer. This technique can make use of an existing oxidation step in VCSEL fabrication processes which allows for increased flexibility in HCG design and in the process design.

The oxide spacer HCG can be utilized to replace an upper distributed Bragg reflector (DBR) in any VCSEL application, such as AlGaAs-based VCSELs. Using the oxide spacer HCG reduces the epitaxial cost of the VCSEL, which is attractive for any application.

The added flexibility of post-type 2D HCG designs could allow for the integration of a flat lens or a phase plate for orbital angular momentum beam generation onto the surface of the VCSEL, leading to new applications. The one dimensional (1D) or two dimensional (2D) HCG can be designed to focus, defocus, deflect and split the output beam into many beams, these beams being also known as diffraction orders. The HCG or 2D HCG can be designed to provide additional optical coupling to neighboring VCSELs when the reflection is split into multiple beams in normal and off-normal angles (diffraction orders). The normal reflection is used to provide reflection for the VCSEL and off-normal angles can be designed to couple into neighboring VCSELs. If the device is flip-chip bonded onto a substrate, the thin upper mirror can provide excellent heat dissipation for high-powered devices.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

Figure 1:
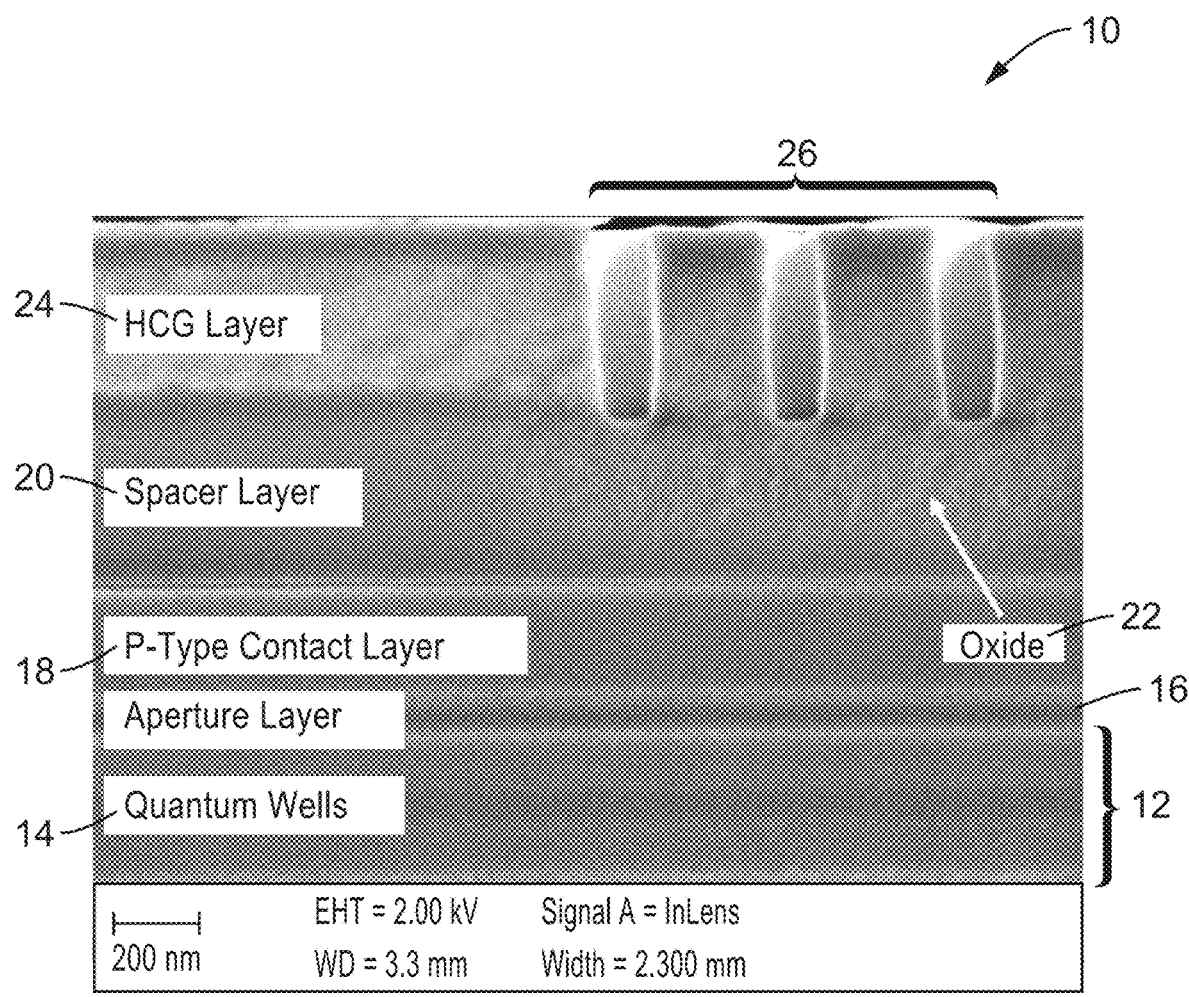
FIG. 1 is an SEM micrograph of an HCG reflector fabricated according to an embodiment of the present disclosure.

Vertical-cavity surface-emitting lasers (VCSELs) are important light sources in short range, high bandwidth communications due to their high coupling efficiency into an optical fiber, high direct modulation rate, and high efficiency. VCSEL arrays are also being applied in light detection and ranging (LIDAR) systems due to their high power and high efficiency. The ultimate advantage of a VCSEL over other types of laser is the extremely low production cost: due to the geometry of a VCSEL individual lasers can be tested during processing. Most importantly this testing can be performed before dicing and packaging. VCSELs have complex epitaxial structures containing hundreds of layers which require precise composition and thickness control, which causes each epi-wafer to cost thousands of dollars before fabrication. As a result, a reduction in the number of layers corresponds to a reduction in VCSEL cost.

Three basic elements are necessary (but not always sufficient) to create a VCSEL: a bottom reflector, an active gain material, and a top reflector. The two reflectors are typically composed of distributed Bragg reflectors (DBRs): alternating $\lambda/4$ layers with different refractive indices, which can reflect greater than 99.9 percent of the incident optical power by causing constructive interference between the waves reflected by each interface. Semiconductor DBRs have a low index contrast ($\Delta n \approx 0.5$), so 20-40 DBR pairs (40-80 layers) are needed to achieve high enough reflectivity for a single VCSEL reflector. The alternating layers also cause conduction-band corrugation and valence-band corrugation, which causes undesired resistance. This resistance can be minimized by using graded interface layers and doping techniques; however this adds additional layers to each DBR pair and reduces the overall reflectivity, requiring more DBR pairs. As a result of these complicating effects, one 30-pair DBR could require 120 epitaxial layers which require precise thickness, composition, and doping control.

The high-contrast grating (HCG) reflector is an alternative to the DBR. An HCG reflector is a single layer of high-index material patterned with a subwavelength grating and surrounded on all sides by a low-index material. The HCG only requires two layers: the HCG layer and the spacer layer. In prior art, HCG reflectors are realized by growing a GaAs spacer layer and an Al0.6Ga0.4As HCG layer. HCG fabrication is performed by defining the Al0.6Ga0.4As HCG using electron-beam lithography and removing the underlying GaAs spacer layer using a selective etchant that does not etch Al0.6Ga0.4As. The resulting structure is an Al0.6Ga0.4As grating suspended over an air spacer. This process is suitable for fabricating one-dimensional HCGs and mesh-type two-dimensional HCGs, which can both provide broadband, polarization sensitive reflectivity. Once the grating is released, however, further processing is limited and must be performed with extreme care. No more lithographic steps are possible, and any mechanical processes could cause damage to the delicate HCG. Furthermore, two-dimensional HCG designs are limited to mesh-type designs, as post-type designs are not mechanically supported.

This disclosure describes a new type of HCG reflector for VCSELs using an oxide spacer and the fabrication process thereof.

FIG. 1 illustrates an example embodiment 10, shown as a scanning electron microscope (SEM) micrograph, of this HCG reflector comprising a subwavelength grating 26 composed of semiconductor 24 disposed on top of a spacer layer 20 (e.g., $Al_{0.92}Ga_{0.08}As$) having an area under the HCG of low refractive index oxide 22 (rough appearing texture area) formed by the selective oxidation of AlxGa1-xAs ($0.8 < x \leq 1$). The material shown to the left of oxide region 22 is not oxidized and thus provides a path for heat dissipation. The oxide spacer layer can be extremely thin: it has been demonstrated at a thickness of less than $\lambda/6$ with working VCSELs. Spacer layer 20 is shown over a P-type contact layer 18, over an aperture layer 16 which is over an active region 12 having Quantum wells 14.

Figure 2A:
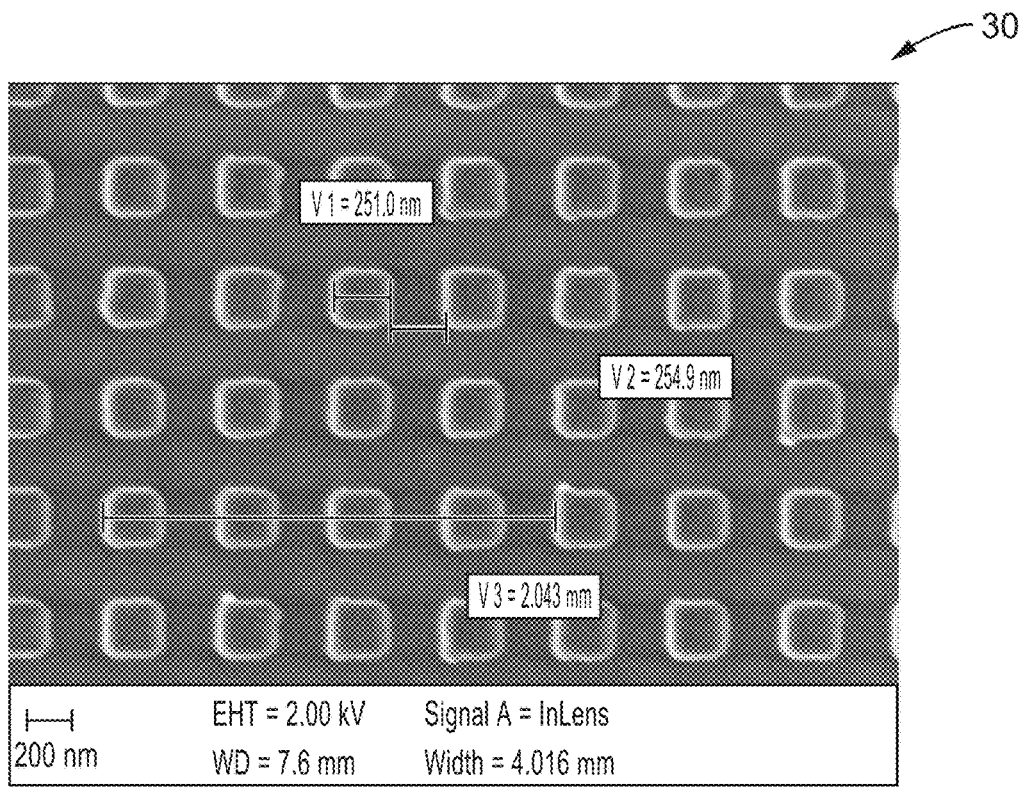
FIG. 2A and FIG. 2B are SEM micrographs of post-style HCG regions shown before and after oxidizing the underlying oxide spacer according to an embodiment of the present disclosure.
Figure 2B:
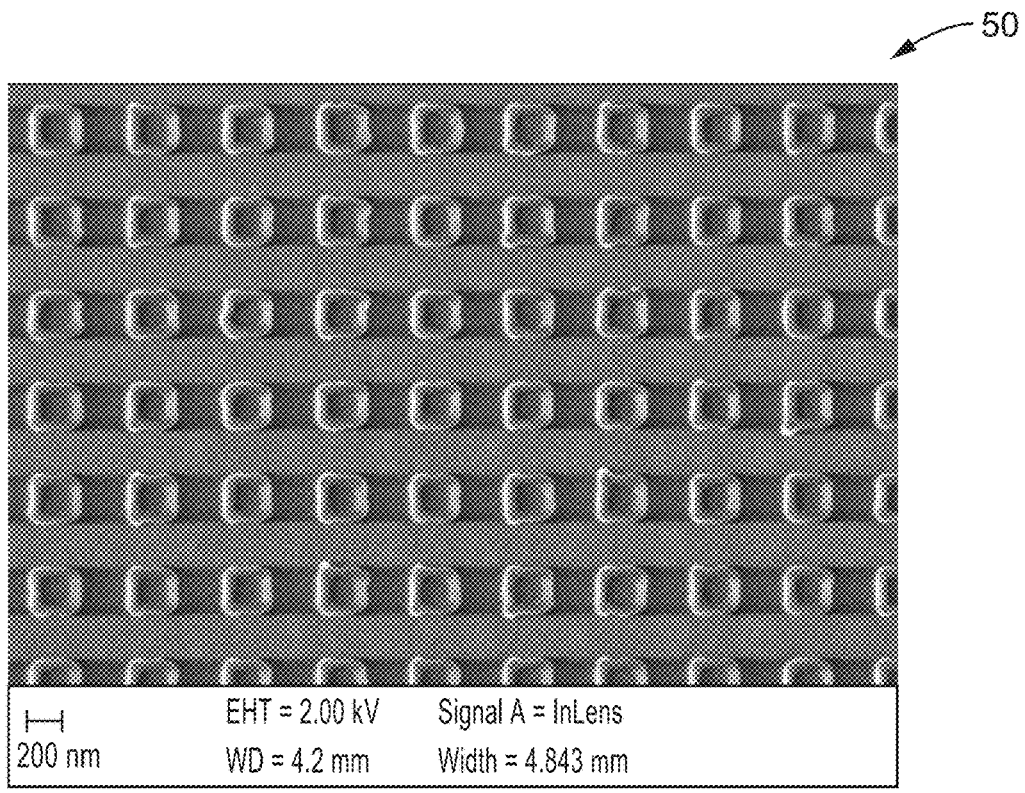

FIG. 2A and FIG. 2B illustrate example embodiments 30, 50 of an oxide spacer layer which can support all HCG designs, herein exemplified as a post-type two-dimensional HCGs. This could enable the monolithic integration of more complex HCG optical elements, such as lenses or phase plates for orbital angular momentum beam generation, directly into the reflector. In FIG. 2A the post type HCG is exemplified before oxidation, and has square posts of 251.0 nm on a side (V1), with spacing between posts of 254.9 nm (V2) and with the total spacing for five posts and associated space at 2.043 μm (V3). In FIG. 2B the posts are shown after oxidation, with the resistive oxide causing image artifacts seen as dark horizontal lines between the posts.

FIG. 3A through FIG. 3D illustrates an example embodiment 70 of an oxide spacer HCG reflector fabricated from an epitaxial structure comprising a spacer layer which can be thermally oxidized to produce an oxide with a low refractive index and an HCG layer which will not significantly change during the oxidation process.

Figure 3A:
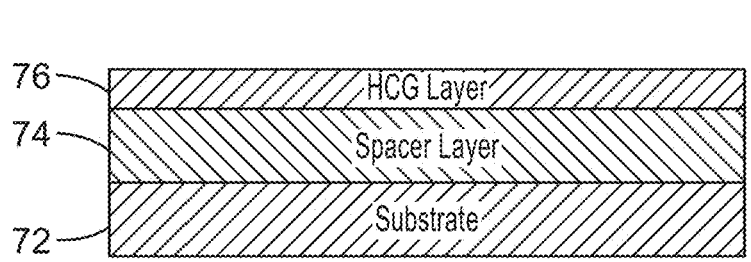
FIG. 3A through FIG. 3D are schematics of process steps in fabricating an oxide spacer HCG according to an embodiment of the present disclosure.
Figure 3B:
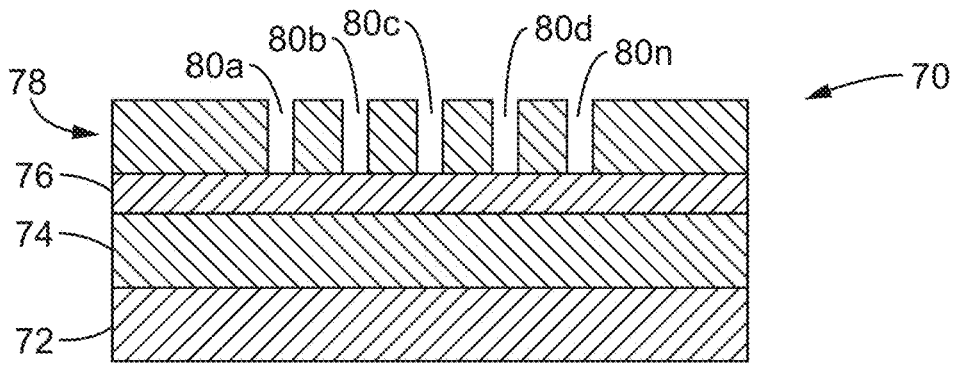
Figure 3C:
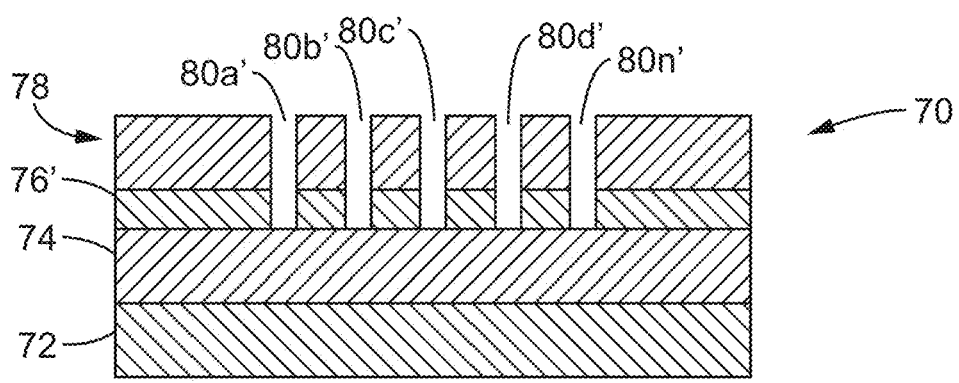
Figure 3D:
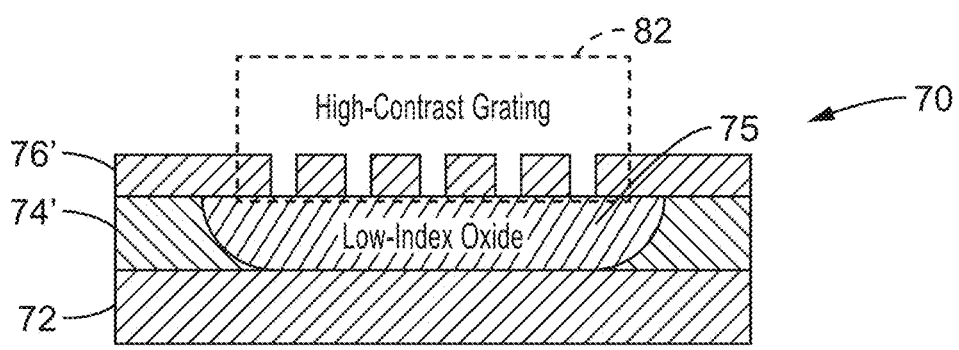

In FIG. 3A an initial structure is seen with substrate 72, over which is a spacer layer 74, over which is an HCG layer 76. In FIG. 3B the HCG is first defined lithographically using, for example, electron-beam, optical, or nanoimprint lithography, showing a resist layer 78 with patterned openings 80a, 80b, 80c, and 80d through 80n. In FIG. 3C, the exposed portion of the HCG layer 76 is then etched 76' down to the spacer layer 74 using, for example, reactive ion etching, inductively-coupled plasma etching, or anisotropic chemical etching. In FIG. 3D the resist layer is removed, and spacer layer 74 is oxidized 74' creating a low-index oxide 75, using for example wet thermal oxidation in a water vapor rich environment. The HCG 82 is shown over the low-index spacer layer of low-index oxide. There is no requirement for the oxidation step to follow the etch step directly—other process steps such as lithography, wet and dry etching, and material deposition may occur in between.

The full oxide spacer HCG process may be performed at the beginning of the VCSEL fabrication process in order to verify the HCG reflectivity before continuing processing. If the HCG reflectivity does not meet the required specifications, the lithography, etch, and oxidation processes can be repeated so long as the lithography is offset from the original attempt. Since wafers with VCSEL epitaxy are very expensive, this rework procedure would save thousands of dollars per wafer that does not pass inspection.

The oxidation step may also be used to simultaneously form a current and light aperture by the lateral oxidation of an aperture layer. The composition of the spacer layer can and should be chosen to oxidize more slowly than the aperture layer to minimize lateral oxidation of the spacer layer and maximize mechanical stability.

The oxide spacer HCG can be incorporated into the VCSEL fabrication process in many different ways. In at least one important embodiment, it can be used to produce high-speed VCSELs for telecommunications or high-powered VCSEL arrays for ranging. For high-speed applications, the layout area of a VCSEL is minimized to reduce the structure's capacitance. Since the HCG bars can be supported solely by the oxide spacer, HCGs with oxide spacers can be fabricated with a significantly smaller footprint than HCGs with air spacers. High-powered VCSEL arrays also benefit from the reduced layout area of the oxide spacer HCG reflector—the reduced area allows for a higher density of apertures, a wider contact grid, and/or additional heat dissipation structures.

Figure 4A:
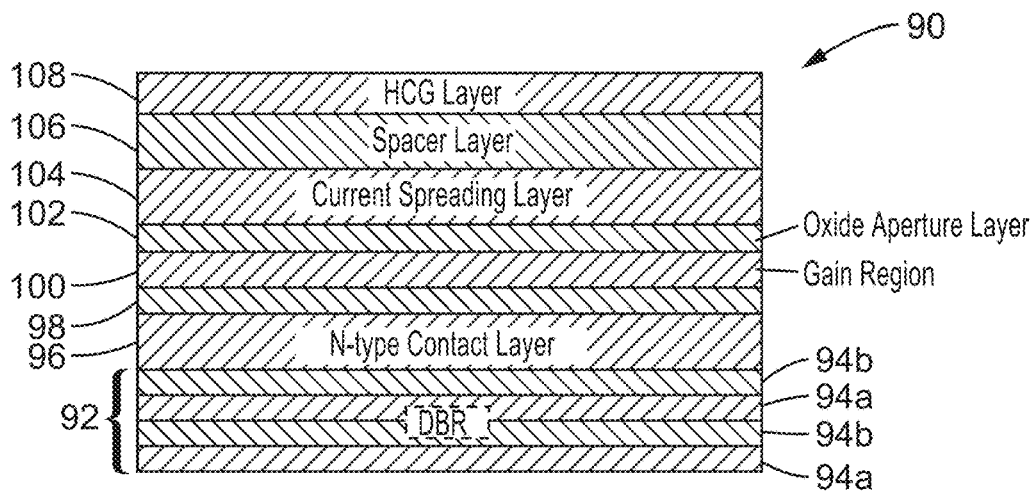
FIG. 4A through FIG. 4E are schematics of process steps in fabricating an oxide spacer HCG as the upper reflectors in a vertical cavity surface emitting laser (VCSEL) formed by a single mesa process according to an embodiment of the present disclosure.

FIG. 4A through FIG. 4F illustrate an example embodiment 90 of a simple VCSEL process to incorporate an oxide spacer HCG in a single-mesa process. In FIG. 4A the VCSEL epitaxy comprises, from bottom to top, a semiconductor DBR 92 having alternating high and low index layers 94a, 94b, 94c, 94d and so forth, an n-type contact layer 96 which may be incorporated into the DBR, a cavity cladding layer 98a multiple quantum well gain region 100, one or more oxide aperture layers 102, a GaAs current spreading layer 104, a spacer composed 106, such as comprising Al0.94Ga0.06As, and an HCG layer 108, such as comprising GaAs.

Figure 4B:
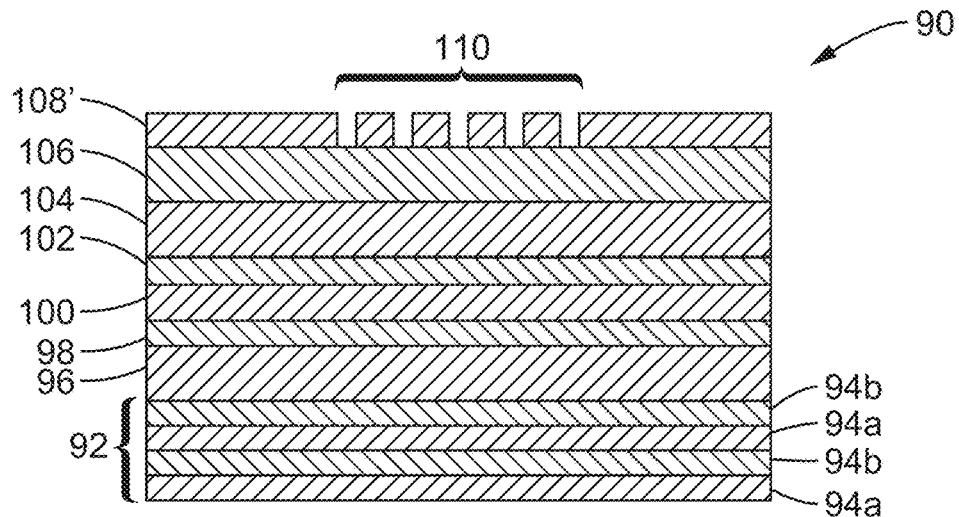

In FIG. 4B the HCG layer 108 is first defined into layer 108' having grating elements and spaces 110, such as by using electron-beam lithography. The HCG is then etched using reactive ion etching, terminating within the spacer layer.

Figure 4C:
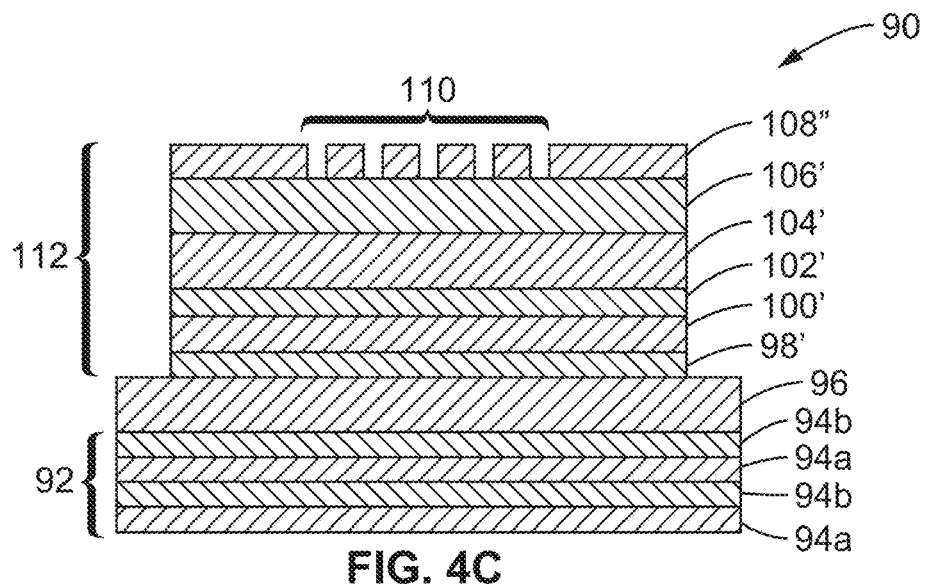

Next, in FIG. 4C a lithography and etch step is used to define a laser diode mesa 112, with layers 98', 100', 102', 104', 106' and 108", whose etching terminates inside the n-type contact layer 96 and exposing the oxide aperture layer in the sidewall of the mesa.

Figure 4D:
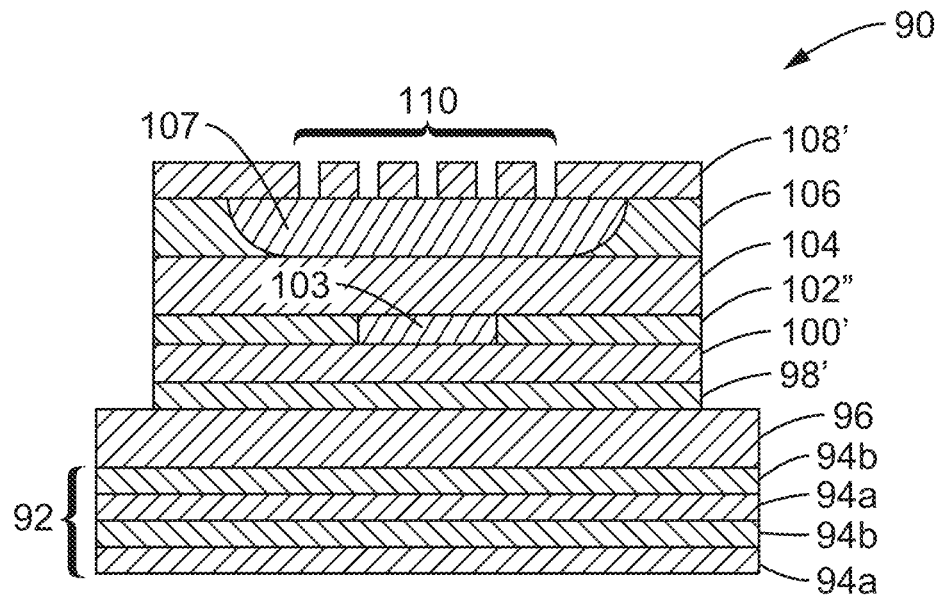
Figure 4E:
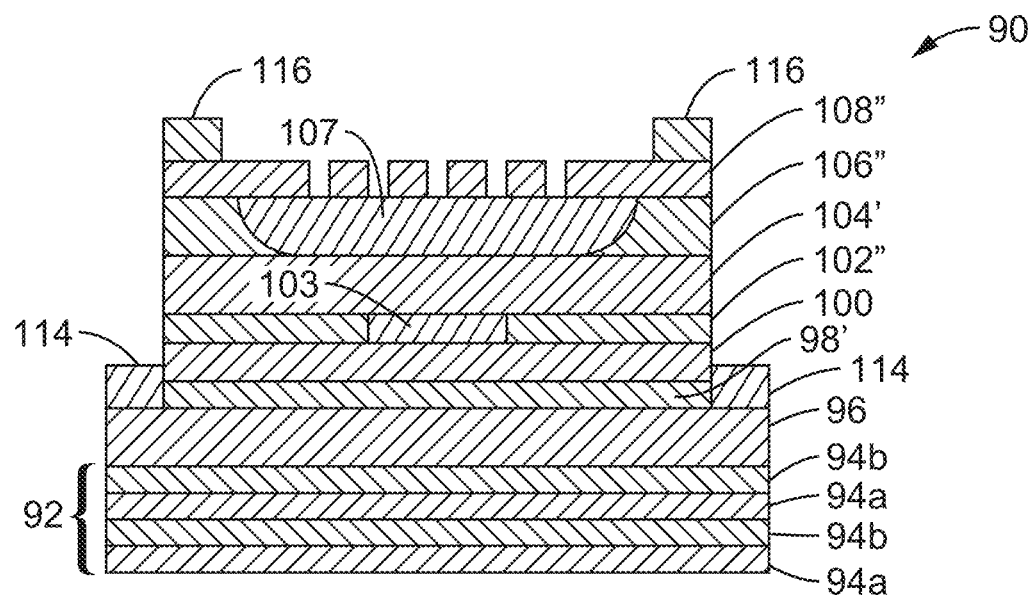

In FIG. 4D a wet thermal oxidation is performed at an elevated temperature (in typical range 400 to 450° C.) in water vapor, oxidizing the spacer layer 106" to create a low-index oxide region 107 through the openings in the HCG and the aperture 103 through the edges of the mesa. Then in FIG. 4E lithography, evaporation, and liftoff are used to define a p-type contact 116 on top of the HCG layer and an n-type contact 114 on the n-type contact layer.

Since the oxide spacer layer in the single-mesa process has a large aluminum mole fraction, the previous design may suffer from a high series resistance. In order to prevent this, a double-mesa process can be utilized.

Figure 5A:
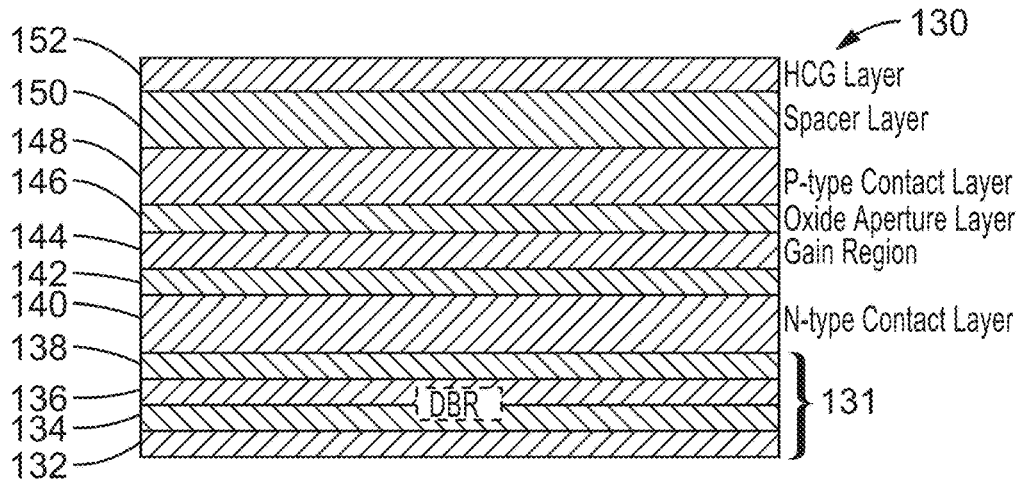
FIG. 5A through FIG. 5F are schematics of process steps in fabricating an oxide spacer HCG as the upper reflector in a vertical cavity surface emitting laser (VCSEL) formed by a double mesa process according to an embodiment of the present disclosure.

FIG. 5A through FIG. 5F illustrates an example embodiment 130 of a double-mesa process. In FIG. 5A the VCSEL epitaxy is shown exemplified from bottom to top with a semiconductor DBR 131 having example layers 132, 134, 136, and 138, followed by an n-type contact layer 140 which may be incorporated into the DBR, a cavity cladding layer 142 a multiple quantum well gain region 144, one or more oxide aperture layers 146, a p-type contact layer 148, a spacer 150 for example comprising Al0.94Ga0.06As, and an HCG layer 152, such as comprising GaAs.

Figure 5B:
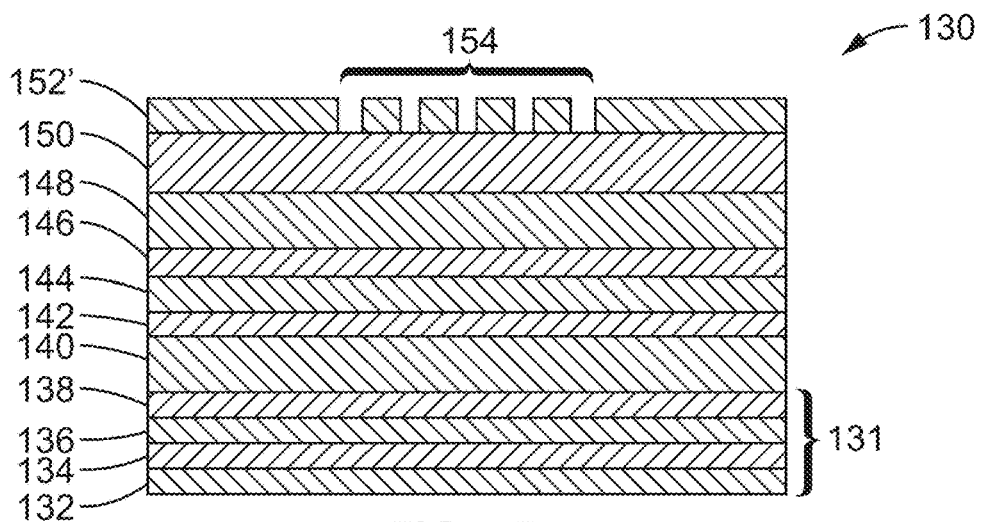
Figure 5C:
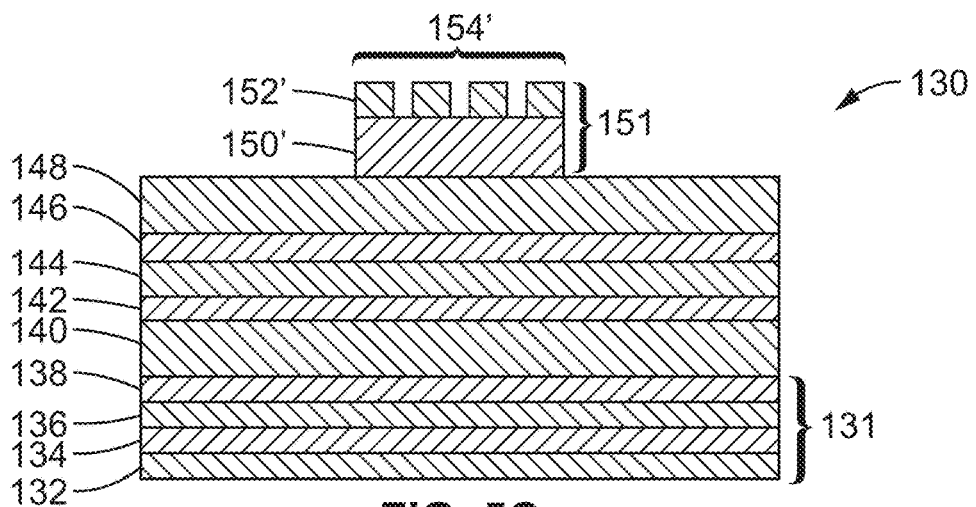
Figure 5D:
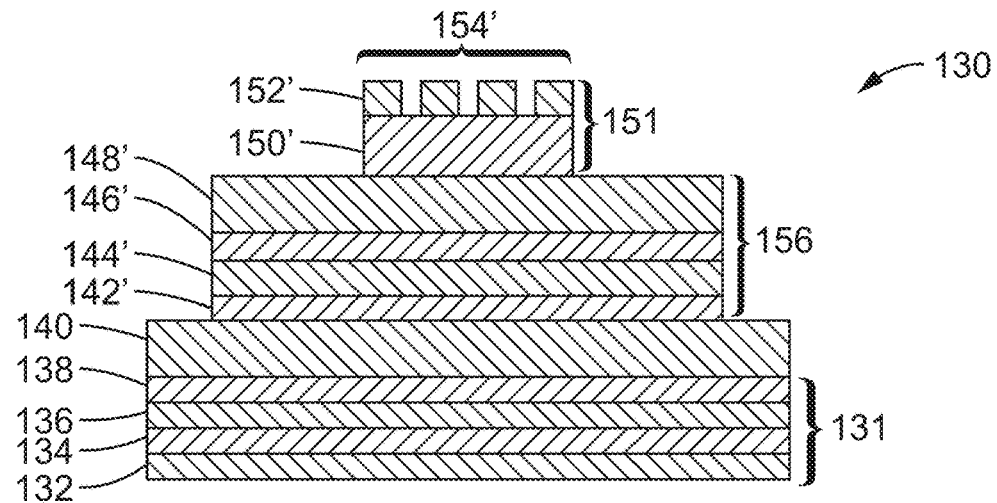
Figure 5E:
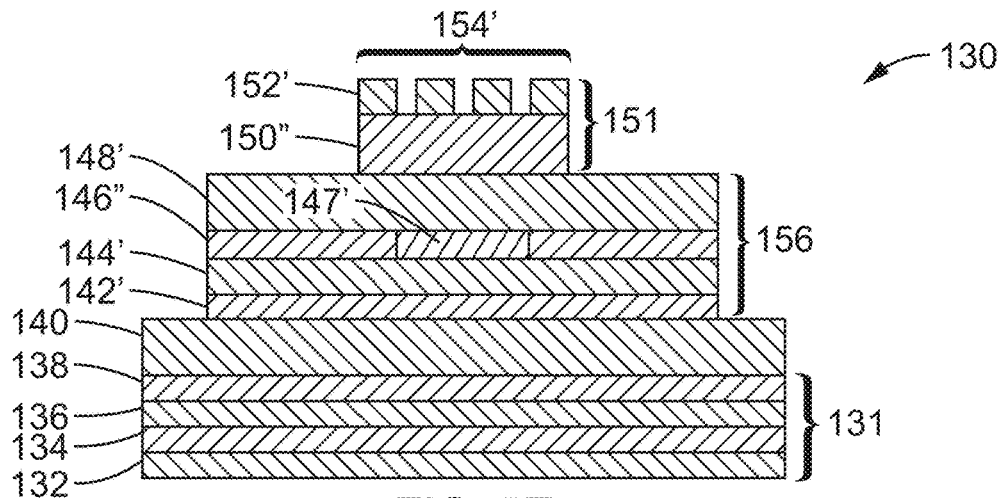
Figure 5F:
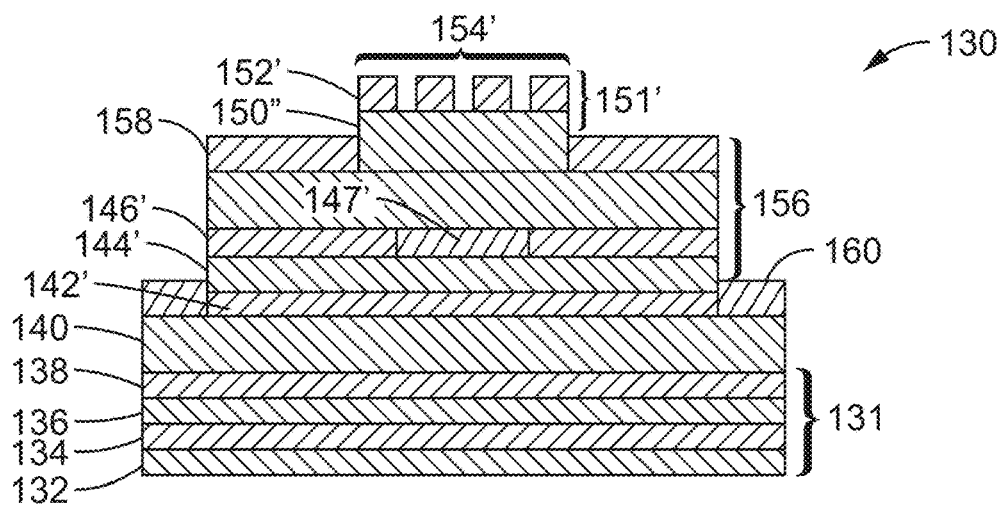

In FIG. 5B the HCG 154 is defined in HCG layer 152' using electron-beam lithography. The HCG is then etched using reactive ion etching, terminating within the spacer layer. In FIG. 5C a lithography and etch step is used to define an HCG mesa 151 with the etch involving HCG layer 152' and spacer layer 150' and terminating inside the p-type contact layer 148. In FIG. 5D another lithography and etch step is used to define a laser diode mesa 156, the etch terminating inside the n-type contact layer 140 and exposing the oxide aperture layer in the sidewall of the mesa. In FIG. 5E an oxidation process, such as wet thermal oxidation, is performed at an elevated temperature (in typical range 400 to 450° C.) in water vapor, oxidizing the spacer layer through the openings in the HCG and the aperture 147 through the edges of the mesa. Finally, in FIG. 5F lithography, evaporation, and liftoff are performed to define a p-type contact 158 on top of the p-type contact layer and an n-type contact 160 on the n-type contact layer.

In order to minimize the layout area, the outer dimensions of the HCG should be larger than the region masked by the HCG mesa lithography. The HCG mesa etch can be used to planarize the unmasked portion of the HCG, leaving the HCG bars suspended only by the underlying oxide. The HCG bars generally do not delaminate from the oxide spacer, but if structural stability is a concern, the HCG mesa mask can be used to completely encircle the HCG. This leaves an unoxidized portion of the oxide spacer layer to provide stability. The unoxidized portion can also be used as a path to conduct waste heat away from the gain region.

The single-mesa and double-mesa processes can both be used to produce individual high-speed VCSELs and high-powered VCSEL arrays.

An oxide-confined VCSEL array may be composed of a large laser diode mesa containing many oxide apertures or a number of individual wafers supported by a single substrate. The former can be realized by creating a periodic lattice of aperture oxidation trenches within the laser diode mesa. These trenches must be etched to a depth which exposes the oxide aperture layer in the sidewalls of the trenches.

Figure 6A:
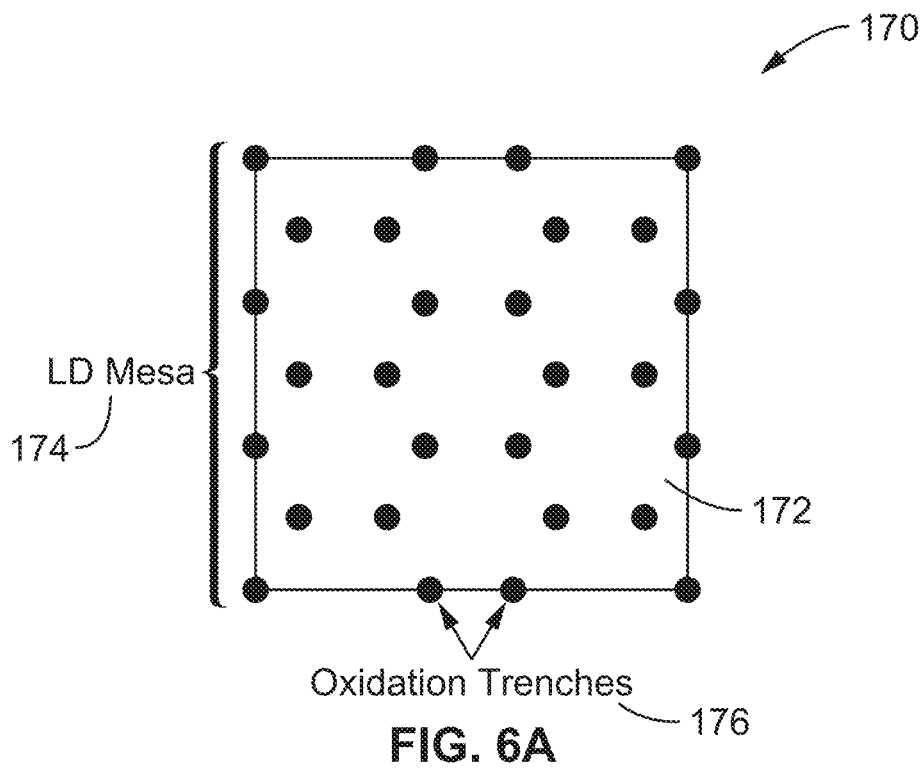
FIG. 6A and FIG. 6B are schematics of process steps in forming oxide apertures according to an embodiment of the present disclosure.
Figure 6B:
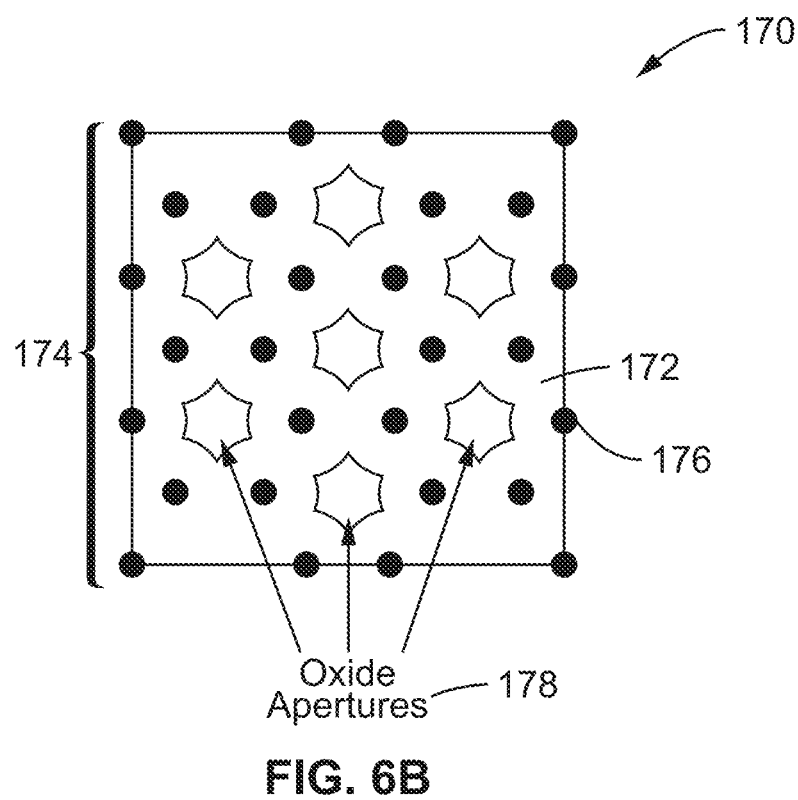

FIG. 6A and FIG. 6B illustrate an example embodiment 170 of creating oxide apertures in the region 172 of an LD mesa 174. In FIG. 6A the material is shown before oxidation, while FIG. 6B depicts the material after oxidation. The oxidized material is insulating, so all current is funneled through the unoxidized apertures. An oxide spacer HCG should be located over each oxide aperture. In FIG. 6A, oxidation trenches 176 are shown, which after the array is oxidized results in creating a lattice of oxide apertures 178 as seen in FIG. 6B, being formed in the spaces between trenches 176. In addition to creating this pattern with an additional lithography and etch step, this can also be realized in the single-mesa or double-mesa fabrication process with existing steps.

In the single-mesa process, the oxidation trenches can be included in the laser diode mesa etch. The dimensions of the trenches and the conditions of the etch must be engineered so that the etch stops at an acceptable depth in the oxidation trenches and outside of the laser diode mesa. In both regions, the etch must proceed to a depth that exposes the oxide aperture layer. In the outer region, the etch must stop within the n-type contact layer. This can be difficult to accomplish due to diffusion and loading effects that cause a slower etch in the narrow trenches. In order to achieve a deeper etch in the oxidation trenches, the trenches may be left unmasked during both the HCG etch and the laser diode mesa etch.

In the double-mesa process, the oxidation trenches can be included in many different steps. For example they are preferably exposed during the HCG mesa etch as well as either the HCG etch or the laser diode mesa etch. If the trenches are exposed during the HCG etch, the RIE lag effect can be used to etch the trenches to a greater depth than the HCG bars. The HCG mesa etch is then used to continue the etch to expose the oxide aperture layer in the sidewalls of the trenches. If the trenches are exposed during the laser diode mesa etch, then loading or diffusion effects must be taken into account when designing the width of the trenches and the conditions of the laser diode mesa etch to ensure that the trench and outer regions reach the desired depth, as discussed previously.

Embodiments of the present technology may be described herein with reference to illustrations of methods and systems according to embodiments of the technology, and/or procedures, algorithms, steps, operations, formulae, or other computational depictions, which may also be implemented as computer program products.

From the description herein, it will be appreciated that the present disclosure encompasses multiple embodiments which include, but are not limited to, the following:

1. A high-contrast grating (HCG) reflector apparatus, comprising: (a) a low-refractive index oxide formed from a spacer layer; and (b) a grating of high-refractive index semiconductor formed from a high contrast grating (HCG) layer, disposed over said low index oxide with combination forming a high contrast grating (HCG) reflector apparatus.

2. A vertical-cavity surface-emitting laser (VCSEL) apparatus, comprising: (a) a lower reflector and an upper reflector; (b) a gain region disposed between said lower and upper reflectors; and (c) wherein said upper reflector and/or said lower reflector comprise an oxide spacer high-contrast grating (HCG) reflector having a low-refractive index oxide formed from a spacer layer, and a grating of high-refractive index semiconductor formed from a high contrast grating (HCG) layer, disposed over said low index oxide.

3. A method of forming a high-contrast grating (HCG) reflector, comprising: (a) etching a grating for a high-contrast grating (HCG) through a high-refractive index material, down to a spacer layer beneath said high-refractive index material; and (b) performing an oxidation process through said grating upon said spacer layer creating a low-refractive index oxide region within said spacer layer beneath said grating.

4. The apparatus or method of any preceding embodiment, wherein said grating comprises an arrangement of bars or posts.

5. The apparatus or method of any preceding embodiment, wherein said reflector is greater than 99% reflective.

6. The apparatus or method of any preceding embodiment, wherein said low-refractive index oxide is configured for being fabricated utilizing selective wet oxidation.

7. The apparatus or method of any preceding embodiment, wherein an epitaxy for the reflector apparatus comprises: (a) a spacer layer configured for being oxidized to form the low-refractive index oxide; and (b) a high-contrast grating (HCG) layer configured to retain a high refractive index through the oxidation process, and to form said grating.

8. The apparatus or method of any preceding embodiment, wherein said spacer layer comprises $Al_xGa_{1-x}As$ (x>0.9) and the HCG layer is $Al_yGa_{1-y}As$ (y<0.4).

9. The apparatus or method of any preceding embodiment, wherein said grating is configured for being fabricated using lithography and etching through the high contrast grating (HCG) layer to expose the underlying spacer layer in creating said low-refractive index oxide.

10. The apparatus or method of any preceding embodiment, wherein said high contrast grating (HCG) reflector apparatus is configured for use in an oxide spacer high contrast grating (HCG) vertical cavity surface emitting laser (VCSEL), as an upper reflector, a lower reflector, or both the upper reflector and lower reflector, of the resultant oxide spacer HCG VCSEL.

11. The apparatus or method of any preceding embodiment, wherein orientation of the atomic structure of said high contrast grating (HCG) layer determines polarization of the oxide spacer HCG VCSEL.

12. The apparatus or method of any preceding embodiment, wherein said polarization increases signal-to-noise ratio when detecting a signal from two or more VCSELs within an array of VCSELs.

13. The apparatus or method of any preceding embodiment, wherein a dense array of VCSELs can be configured to different polarizations in different areas of the array to provide structured illumination determined by polarization.

14. The apparatus or method of any preceding embodiment, wherein said grating comprises two-dimensional (2D) posts forming a two-dimensional high-contrast grating (HCG) reflector apparatus, or high contrast metastructure.

15. The apparatus or method of any preceding embodiment, wherein said two-dimensional (2D) posts are of a uniform size and shape, or have varied sizes and shape, to provide a reflection or transmission phase distribution in the plane of laser emission to focus, defocus, deflect, or split the output beams, and/or result in specific optical angular momentum.

16. The apparatus or method of any preceding embodiment, wherein said high-contrast grating (HCG) reflector apparatus is configured for use in an oxide spacer high contrast grating (HCG) vertical cavity surface emitting laser (VCSEL) to provide additional optical coupling to the HCG VCSEL when a reflection is split into multiple beams at normal angles, and coupling into neighboring VCSELs when the reflection is split at off-normal angles.

17. The apparatus or method of any preceding embodiment, further comprising an oxide aperture layer disposed above said gain region and below said upper reflector.

18. The apparatus or method of any preceding embodiment, wherein said oxide aperture layer comprises $Al_xGa_{1-x}As$ (x>0.9).

19. The apparatus or method of any preceding embodiment, wherein said oxide aperture layer is oxidized laterally to form a current and light aperture.

20. The apparatus or method of any preceding embodiment, wherein said vertical-cavity surface-emitting laser (VCSEL) apparatus is configured in an array having either individual vertical-cavity surface-emitting laser (VCSEL) mesas, or one large vertical-cavity surface-emitting laser (VCSEL) mesa configured with multiple current apertures.

21. The apparatus or method of any preceding embodiment, wherein said method is utilized in fabricating the upper reflector, lower reflector, or both upper and lower reflectors, as an oxide spacer high-contrast grating (HCG) in a vertical cavity surface emitting laser (VCSEL) device or array fabricated using a single-mesa or double-mesa process.

22. The apparatus or method of any preceding embodiment, wherein said vertical cavity surface emitting laser (VCSEL) device or each VCSEL in an array VCSEL devices is fabricated having a lower reflector, an N-type contact layer, an upper reflector, a gain region disposed between said lower and upper reflectors, and an oxide aperture layer disposed above said gain region and below said upper reflector, and a p-type contact layer above said oxide aperture layer and said upper reflector; and wherein layers above said n-type contact layer up to at least said upper reflector are part of a mesa region; and further comprising fabricating a lattice of oxidation trenches into a mesa region to expose the oxide aperture layer and oxidize a central portion of it in forming at least one aperture.

23. The apparatus or method of any preceding embodiment, wherein said lattice of oxidation trenches are formed by etching.

24. The apparatus or method of any preceding embodiment, wherein said depth of said etching is less than approximately 1 μm when the top reflector comprises an oxide spacer high-contrast grating (HCG).

25. The apparatus or method of any preceding embodiment, wherein an oxidation step is performed on said oxide aperture layer to oxidize it laterally to form a lattice of apertures between the oxidation trenches.

26. The apparatus or method of any preceding embodiment, wherein said oxidation step is utilized to simultaneously form a current and light aperture in the vertical cavity surface emitting laser (VCSEL) device.

27. The apparatus or method of any preceding embodiment, wherein composition of the spacer layer and the oxide aperture layer are selected having different oxidation rates to facilitate using wet oxidation to simultaneously form a current and light aperture to define the oxide spacer high-contrast grating (HCG).

28. The apparatus or method of any preceding embodiment, wherein orientation of the atomic structure of said high contrast grating (HCG) layer determines polarization of the oxide spacer high-contrast grating (HCG) vertical cavity surface emitting laser (VCSEL) device or array.

29. The apparatus or method of any preceding embodiment, wherein said polarization increases signal-to-noise ratio when detecting a signal from two or more VCSELs within an array of VCSELs.

30. The apparatus or method of any preceding embodiment, wherein an array of VCSELs can be configured for different polarizations in different areas of the array to provide structured illumination determined by polarization.

31. A high-contrast grating comprising a high-index semiconductor grating resting atop a low-index oxide (herein referred as oxide spacer, OS) can be fabricated with selective wet oxidation to produce a highly reflective (>99%) mirror.

32. The apparatus or method of any preceding embodiment, wherein the epitaxy for the reflector may include (1) a spacer layer which can be oxidized to form a low-refractive index oxide and (2) an HCG layer which will retain a high refractive index through the oxidation process. In one embodiment, the spacer layer is AlxGa1-xAs (x>0.9) and the HCG layer is AlyGa1-yAs (y<0.4).

33. The apparatus or method of any preceding embodiment, wherein the fabrication process may comprise: (1) defining the HCG using lithography and etching through the HCG layer to expose the underlying spacer layer (2) oxidizing the underlying spacer layer.

34. The apparatus or method of any preceding embodiment, wherein a vertical-cavity surface-emitting laser (VCSEL) can be fabricated using the oxide-spacer HCG reflector. Said VCSEL may comprise a lower reflector, a gain region, and an upper reflector. Said VCSEL may also comprise an oxide aperture layer, composed of AlxGa1-xAs (x>0.9), which is oxidized laterally to form a current and light aperture. The oxide spacer HCG reflector may be implemented as one or both reflectors.

35. The apparatus or method of any preceding embodiment, wherein a VCSEL array can be fabricated using the oxide-spacer HCG reflector. Said VCSEL array may comprise a lower reflector, a gain region, and an upper reflector. Said VCSEL may also comprise an oxide aperture layer, composed of AlxGa1-xAs (x>0.9), which is oxidized laterally to form a current and light aperture. The array may be an ensemble of individual VCSEL mesas or one large VCSEL mesa with many current apertures. The latter may be fabricated by etching a lattice of oxidation trenches into a large laser diode mesa to expose the oxide aperture layer. This depth of this etch can be less than 1 μm when an oxide spacer HCG is used as the top reflector. When the VCSEL array is oxidized, the oxide aperture layer is oxidized laterally to form a lattice of apertures between the trenches.

36. The apparatus or method of any preceding embodiment, wherein the oxidation step may or may not be used to simultaneously form a current and light aperture in the VCSEL of select embodiments. The composition of the spacer layer and the aperture layer can and should be chosen to have different oxidation rates. Using wet oxidation to simultaneously form a current and light aperture to define an oxide spacer HCG is a novel approach.

37. The apparatus or method of any preceding embodiment, wherein the HCG orientation determines the polarization of an oxide spacer HCG VCSEL. This can be leveraged to increase the signal-to-noise ratio when detecting the signal from two or more VCSELs. A dense array may have different polarizations in different areas of the array to facilitate structured illumination determined by polarization.

38. The apparatus or method of any preceding embodiment, wherein the HCG may be in the form of 2D posts to form 2D HCG reflector (also known as high contrast metastructure). The posts may be uniform or have varied sizes and shapes to provide a reflection or transmission phase distribution in the plane of laser emission to focus, defocus, deflect, or split the output beams, and/or result in specific optical angular momentum.

39. The apparatus or method of any preceding embodiment, wherein the HCG or 2D HCG can be designed to provide additional optical coupling to neighboring VCSELs when the reflection is split into multiple beams in normal and off-normal angles (also known as diffraction orders). The normal reflection is used to provide reflection for the VCSEL and off-normal angle can be designed to couple into neighboring VCSELs.

As used herein, the singular terms "a," "an," and "the" may include plural referents unless the context clearly dictates otherwise. Reference to an object in the singular is not intended to mean "one and only one" unless explicitly so stated, but rather "one or more."

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. An oxide-spacer high-contrast grating (HCG) reflector apparatus formed as part of an epitaxial structure, comprising:
   (a) a grating of high-refractive index semiconductor formed from patterning a high contrast grating (HCG) layer disposed over an oxidizable spacer layer;
   (b) an area of low-refractive index oxide formed locally within said oxidizable spacer layer beneath the grating, with the combination forming a HCG reflector apparatus; and
   (c) wherein said low-refractive index oxide is formed locally within said oxidizable spacer layer by performing oxidation of the oxidizable spacer layer through the grating of the HCG layer, and wherein the material of said HCG layer is selected to retain a high refractive index through this oxidation process.

2. The apparatus of claim 1, wherein said grating comprises an arrangement of bars or posts.

3. The apparatus of claim 1, wherein said reflector is greater than 99% reflective.

4. The apparatus of claim 1, wherein said low-refractive index oxide is configured for being fabricated utilizing selective wet oxidation.

5. The apparatus of claim 1, wherein said oxidizable spacer layer comprises AlxGa1-xAs (x>0.8) and the HCG layer is AlyGa1-yAs (y<0.4).

6. The apparatus of claim 1, wherein said grating is configured for being fabricated using lithography and etching through the high contrast grating (HCG) layer to expose the underlying oxidizable spacer layer in creating said low-refractive index oxide.

7. The apparatus of claim 1, wherein said oxidizable spacer layer high contrast grating (HCG) reflector apparatus is configured for use in an oxide spacer high contrast grating (HCG) vertical cavity surface emitting laser (VCSEL), as an upper reflector, a lower reflector, or both the upper reflector and lower reflector, of the resultant oxide spacer HCG VCSEL.

8. The apparatus of claim 7, wherein orientation of the atomic structure of said high contrast grating (HCG) layer determines polarization of the oxide spacer HCG VCSEL.

9. The apparatus of claim 8, wherein said polarization increases signal-to-noise ratio when detecting a signal from two or more VCSELs within an array of VCSELs.

10. The apparatus of claim 9, wherein a dense array of VCSELs can be configured to different polarizations in different areas of the array to provide structured illumination determined by polarization.

11. The apparatus of claim 1, wherein said grating comprises two-dimensional (2D) posts forming a two-dimensional high-contrast grating (HCG) reflector apparatus, or high contrast metastructure.

12. The apparatus of claim 11, wherein said two-dimensional (2D) posts are of a uniform size and shape, or have varied sizes and shape, to provide a reflection or transmission phase distribution in the plane of laser emission to focus, defocus, deflect, or split the output beams, and/or result in specific optical angular momentum.

13. The apparatus of claim 1, wherein said high-contrast grating (HCG) reflector apparatus is configured for use in an oxide spacer high contrast grating (HCG) vertical cavity surface emitting laser (VCSEL) to provide additional optical coupling to the HCG VCSEL when a reflection is split into multiple beams at normal angles, and coupling into neighboring VCSELs when the reflection is split at off-normal angles.

14. A vertical-cavity surface-emitting laser (VCSEL) apparatus, comprising:
   (a) a lower reflector and an upper reflector; and
   (b) a gain region disposed between said lower and upper reflectors;
   (c) wherein said upper reflector and/or said lower reflector comprise an oxide spacer high-contrast grating (HCG) reflector formed as part of an epitaxial structure, comprising:
      (i) a grating of high-refractive index semiconductor formed from patterning a high contrast grating (HCG) layer disposed over an oxidizable spacer layer;
      (ii) an area of low-refractive index oxide formed locally within said oxidizable spacer layer beneath the grating, with the combination forming a HCG reflector apparatus; and
      (iii) wherein said low-refractive index oxide is formed locally within said oxidizable spacer layer by performing oxidation of the oxidizable spacer layer through the grating of the HCG layer, and wherein the material of said HCG layer is selected to retain a high refractive index through this oxidation process.

15. The apparatus of claim 14, further comprising an oxide aperture layer disposed above said gain region and below said upper reflector.

16. The apparatus of claim 15, wherein said oxide aperture layer comprises AlxGa1-xAs (x>0.8).

17. The apparatus of claim 15, wherein said oxide aperture layer is oxidized laterally to form a current and light aperture.

18. The apparatus of claim 14, wherein said vertical-cavity surface-emitting laser (VCSEL) apparatus is configured in an array having either individual vertical-cavity surface-emitting laser (VCSEL) mesas, or one large vertical-cavity surface-emitting laser (VCSEL) mesa configured with multiple current apertures.

19. The apparatus of claim 1, wherein utilizing said low-refractive index oxide formed locally within said oxidizable spacer layer overcomes the mechanical stability issues arising when using an air spacer low refractive index region beneath the HCG.

20. The apparatus of claim 1, wherein patterning the HCG layer comprises lithographically defining the pattern and etching through portions of the HCG layer down to, or terminating within, the oxidizable spacer layer.

21. The apparatus of claim 20, wherein between the selective etching through portions of the HCG layer down to the oxidizable spacer layer, and the locally oxidizing said oxidizable spacer layer beneath the grating, additional process steps may be performed.

22. The apparatus of claim 21, wherein said other process steps are selected from the group of process steps consisting of lithography, wet and dry etching, and material deposition.

23. The apparatus of claim 14, wherein utilizing said low-refractive index oxide formed locally within said oxidizable spacer layer overcomes the mechanical stability issues arising when using an air spacer low refractive index region beneath the HCG.

24. The apparatus of claim 14, wherein patterning the HCG layer comprises lithographically defining the pattern and etching through portions of the HCG layer down to, or terminating within, the oxidizable spacer layer.

25. The apparatus of claim 24, wherein between the selective etching through portions of the HCG layer down to the oxidizable spacer layer, and the locally oxidizing said oxidizable spacer layer beneath the grating, additional process steps may be performed.

26. The apparatus of claim 25, wherein said other process steps are selected from the group of process steps consisting of lithography, wet and dry etching, and material deposition.

\* \* \* \* \*